United States Patent [19]

Schwalke

[11] Patent Number: 5,416,041

[45] Date of Patent: May 16, 1995

[54] METHOD FOR PRODUCING AN INSULATING TRENCH IN AN SOI SUBSTRATE

[75] Inventor: Udo Schwalke, Heldenstein, Germany

[73] Assignee: Siemens Aktiengesellschaft, Munich, Germany

[21] Appl. No.: 290,097

[22] Filed: Aug. 15, 1994

[30] Foreign Application Priority Data

Sep. 27, 1993 [DE] Germany .......................... 43 32 842.3

[51] Int. Cl.6 ............................................ H01L 21/76
[52] U.S. Cl. ...................................................... 437/62
[58] Field of Search .................. 437/62; 148/DIG. 85, 148/DIG. 86

[56] References Cited

U.S. PATENT DOCUMENTS

| | | | |
|---|---|---|---|
| 4,666,556 | 5/1987 | Fulton et al. | |
| 4,956,307 | 9/1990 | Pollack et al. | 437/62 |
| 5,061,653 | 10/1991 | Teng | 437/67 |
| 5,084,408 | 1/1992 | Baba et al. | 437/62 |
| 5,156,995 | 10/1992 | Fitzgerald, Jr. et al. | 437/90 |
| 5,223,450 | 6/1993 | Fujino et al. | 437/62 |

FOREIGN PATENT DOCUMENTS

| | | |
|---|---|---|
| 0245622 | 11/1987 | European Pat. Off. |
| 0296754 | 12/1988 | European Pat. Off. |
| 0459397 | 12/1991 | European Pat. Off. |
| 61-32540 | 2/1986 | Japan |
| 61-182220 | 8/1986 | Japan |
| 62-245646 | 10/1987 | Japan |
| 62-276850 | 12/1987 | Japan |
| 350822 | 3/1991 | Japan |
| 3127850 | 5/1991 | Japan |
| 4134844 | 8/1992 | Japan |
| 4137557 | 12/1992 | Japan |
| 8504760 | 10/1985 | WIPO |

OTHER PUBLICATIONS

K. Fujino et al., "Surface Modification of Base Materials for TEOS/O3 Atmospheric Pressure Chemical Vapor Deposition", 1046 Journal of the Electrochemical Society Bd. 139(1992) Jun., No. 6, Manchester, N.H., US, pp. 1690–1692.

IBM Technical Disclosure Bulletin, "Sidewall Channel-Stop Doping For Deep-Trench Isolation of FET Devices", vol. 27, No. 10A Mar. 1985, pp. 5501–5504.

"Sidewall Channel-Stop Doping for Deep-Trench Isolation of FET Devices", IBM Technical Disclosure Bulletin, vol. 27, No. 10A, Mar. 1985, pp. 5501–5504.

"Voidless Final Closure Process for Polysilicon Trench", IBM Technical Disclosure Bulletin, vol. 28, No. 10, Mar. 1986, pp. 4594–4595.

"New 500V Output Device Structures for Thin Silicon Layer on Silicon Dioxide Film", A. Nakagawa, et al., Toshiba Research & Dev. Center Electronics Center, Proc. of 1990 pp. 97–101.

"Evaluation of Dislocation Generation in U-Groove Isolation", Tamaki et al., J. Electrochem. Soc. Solid State Science and Technology, Mar. 1988, pp. 726–730.

*Primary Examiner*—George Fourson
*Attorney, Agent, or Firm*—Hill, Steadman & Simpson

[57] ABSTRACT

A method is provided for producing an insulation trench in an SOI substrate having a monocrystalline silicon layer and an insulating layer, a trench that extends onto the insulating layer and whose cross-section at the surface of the insulating layer is widened by under-etchings of the monocrystalline layer by etching into the monocrystalline silicon layer. A silicon structure is formed that at least covers the sidewalls of the trench and fills the under-etchings. The silicon structure is recrystallized and at least partially oxidized in a temperature step. The trench is filled with an insulation structure.

8 Claims, 4 Drawing Sheets

METHOD FOR PRODUCING AN INSULATING TRENCH IN AN SOI SUBSTRATE

BACKGROUND OF THE INVENTION

1. Field of the Invention

The present invention relates generally to semiconductors and more specifically to a method for producing an insulating trench in an SOI substrate.

2. Description of the Related Art

For integrating components in SOI substrates having a monocrystalline silicon layer, an insulating layer of $SiO_2$ arranged thereon and a monocrystalline silicon layer arranged on the insulating layer of $SiO_2$, the integrated components are produced in the monocrystalline silicon layer. Neighboring components or component groups are completely electrically insulated from one another vertically by the insulating layer and laterally by trenches that completely surround the respective component or component group. The trenches usually extend down onto the insulating layer and are filled with $SiO_2$. The term dielectric insulation has become standard for this insulation.

In Smart Power Technology, complex logic components are integrated monolithically in a substrate with high-voltage power components. Since the logic components are operated with voltage levels around five volts but voltages of up to 500 volts occur in the high-voltage power components, an electrical separation of the high-voltage components from the logic components is required. Given SOI substrates, dielectric insulation is used for electrical separation of components in Smart Power Technology (see, for example, A. Nakagawa et al. ISPS 1990, pages 97–101).

In SOI substrates produced according to the direct wafer bonding (DWB) method (see, for example, A. Nakagawa et al. ISPS 1990, pages 91–101), the layer thickness of the monocrystalline silicon layer of SOI substrates is typically 20 $\mu$m. This means that 20 $\mu$m deep trenches must be etched by dry-etching into the monocrystalline silicon layer for producing insulation trenches that surround components to be insulated.

In order to assure that the monocrystalline silicon layer is completely etched through everywhere on the SOI substrate, the etching duration in this process step is usually lengthened by 10–50 percent compared to the value at which the monocrystalline layer is just etched through. Dry-etching processes that attack selectively relative to $SiO_2$ are used for trench etching. The trench etching therefore stops at the surface of the insulating layer of the SOI substrate side. The dry-etching processes used etch anisotropically. In addition to the principal vertical etching component, however, these etching methods also have a lateral part. In the over-etching, this leads to under-etchings of the monocrystalline silicon layer forming at the surface of the insulating layer. These under-etchings of the monocrystalline silicon layer lead to a widening of the cross section of the trench at the surface of the insulating layer.

During the further course of processing, these under-etchings lead to difficulties, particularly given a thermal oxidation of the sidewalls of the trench. In the thermal oxidation of the sidewalls of the trench, a so-called bird's beak is formed at the floor of the trench in the region of the under-etchings. Since a trench mask that contains a $Si_3N_4$ layer is usually used for trench etching, which protects the surface of the monocrystalline silicon layer during the thermal oxidation of the sidewalls, the formation of a bird's beak also occurs at the upper edge of the trench during the thermal oxidation. The formation of the bird's beak is a consequence of the increase in volume during the oxidation. This bird's beak leads to mechanical stresses at the upper edge of the trench as well as at the floor of the trench. These stresses at the upper edge of the trench can be reduced by deformation of the relatively thin mask layer. This, however, is not possible at the floor of the trench.

As a consequence of mechanical stresses, crystal defects form in the monocrystalline silicon layer at the upper edge and at the floor of the trench. The disturbance of the crystal lattice is greater when the mechanical stresses are higher. These crystal defects deteriorate the function of the components integrated in the monocrystalline silicon layer; they reduce the yield.

EP 0459397 A2 discloses that the mechanical stresses due to the formation of a bird's beak at the upper edge of the trench can be avoided in the thermal oxidation of the surface of a trench that is etched into a substrate of monocrystalline silicon by a bevelling of the upper edge of the trench by using incipient etching.

Y. Tamaki et al, J. Electrochem. Soc. 135, page 726 (1988) discloses that the upper edge of the trench can be bevelled by incipient etching and the trench floor can be rounded. This is done to avoid mechanical stresses due to the arising $SiO_2$ in the thermal oxidation of the surface of a trench that is etched into a substrate of monocrystalline silicon.

U.S. Pat. No. 5,061,653 discloses a field oxide bird's beak fashioned laterally of a trench that is etched into a substrate of monocrystalline silicon. The trench has an oxidized surface. As a result thereof, mechanical stresses that occur due to the oxidation of the surface of the trench are reduced at the surface of the substrate.

Additional steps that increase the complexity of the process are introduced in all these methods. The appearance of the under-etchings at the trench floor when trenches are etched into the monocrystalline silicon layer of an SOI substrate is related to the insulating layer of $SiO_2$ arranged under the monocrystalline silicon layer. The under-etchings are related to the necessary step of etching completely through the monocrystalline layer for the dielectric insulation. Such under-etchings do not occur when etching trenches in substrates of monocrystalline silicon. The measures known from the above three references are not suitable for dismantling mechanical stresses in the region of the under-etchings given a trench in an SOI substrate.

SUMMARY OF THE INVENTION

It is an object of the present invention to provide a method for producing an insulation trench in an SOI substrate whereby crystal defects in the monocrystalline silicon layer of an SOI substrate caused by mechanical stresses are reduced.

The object of the present invention is inventively achieved in a method for producing an insulation trench in an SOI substrate having the steps of providing an SOI substrate having a monocrystalline silicon wafer, an insulating layer of $SiO_2$ arranged thereon and a monocrystalline silicon layer arranged on a surface of the insulating layer, etching a trench having sidewalls into the monocrystalline silicon layer, the trench extending onto the insulating layer and having a cross-section at the surface of the insulating layer that is widened by under-etchings of the monocrystalline silicon layer, forming a silicon structure to at least cover the sidewalls of the trench and fill the under-etchings, recrystallizing the silicon structure in a heating step, at least partially oxidizing the silicon structure, and filling the trench with an insulation structure.

In the method of the invention, a silicon structure that at least covers the sidewalls of the trench and fills the under-etchings is formed after the trench etching. The silicon structure is preferably amorphous silicon. The silicon structure is recrystallized in a temperature step. The re-crystallization thereby proceeds from the sidewall of the trench that is formed by the surface of the monocrystalline layer of the SOI substrate. Subsequently, the surface of the silicon structure is oxidized. During this oxidation, the lateral oxidation at the boundary surface between the insulating layer and the monocrystalline silicon layer of the SOI substrate is highly suppressed. As a result thereof, the mechanical stresses that can lead to crystal defects in the monocrystalline silicon layer are effectively reduced.

When a trench mask that at least has a $Si_3N_4$ layer and that remains on the surface of the monocrystalline silicon layer during the filling of the trench is used for trench etching, then $SiO_2$ formed in the upper region of the trench by thermal oxidation can relax more easily since it is not limited by the $Si_3N_4$ layer of the trench mask at the surface. In this case, mechanical stresses are also reduced at the upper edge of the trench.

The silicon structure is formed, in particular, by surface-wide deposition of a silicon layer having essentially conformal edge coverage and by subsequent anisotropic etching of the silicon layer as a spacer. The silicon layer can be deposited polycrystalline or amorphous. Amorphous silicon is preferably used because of better homogeneity.

The silicon layer can be deposited doped or undoped. When the silicon layer is produced with a dopant concentration of at least $10^{20}$ cm$^{-3}$, then $SiO_2$ formed by thermal oxidation of the silicon layer exhibits improved flow behavior that leads to a further reduction of mechanical stresses in the trench.

For simplifying the process, it lies within the scope of the invention to combine the temperature step for the recrystallization of the silicon structure with the following oxidation. In this case, it must be assured in the oxidation that a temperature profile is traversed when approaching the oxidation temperature such that the recrystallization begins.

It is likewise possible to recrystallize the silicon layer as a whole and to subsequently implement the anisotropic etching step for spacer formation.

The invention shall be set forth in greater detail below with reference to the exemplary embodiments and to the figures.

DETAILED DESCRIPTION OF THE PREFERRED EMBODIMENTS

Figure 1:
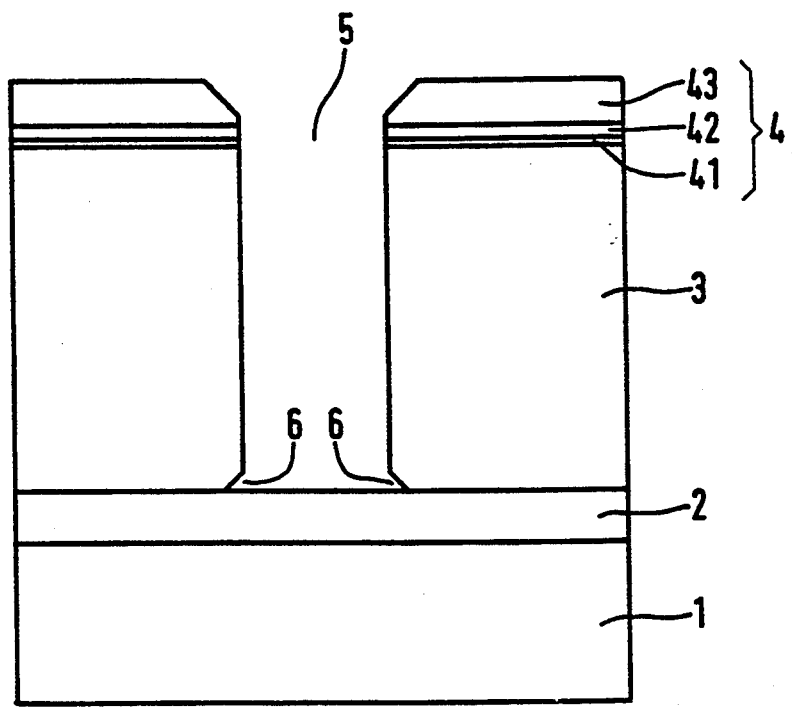
FIG. 1 shows an SOI substrate of the present invention with a trench mask and an etched trench that has under-etchings at its floor.

The present invention provides an SOI substrate having a monocrystalline silicon wafer 1 that, for example, is p+ doped, with an insulating layer 2 of $SiO_2$ arranged thereon, and a monocrystalline silicon layer 3 arranged on the insulating layer 2 (See FIG. 1). The SOI substrate is preferably manufactured according to a direct wafer bonding (DWB) method. The thickness of the insulating layer 2, for example, is 2 $\mu$m. The thickness of the monocrystalline silicon layer 3, for example, is 20 $\mu$m. The monocrystalline silicon layer 3, for example, is n-doped with a dopant concentration of $10^{14}$ phosphorous atoms/cm$^3$. Components are subsequently manufactured in the monocrystalline silicon layer 3.

A trench mask 4 is applied onto the surface of the monocrystalline silicon layer 3. The trench mask 4 has a lower layer 41, a middle layer 42, and an upper layer 43. The lower layer 41 is produced, for example, with a thickness of 50 nm by thermal oxidation. The middle layer 42 is produced with a thickness of, for example, 150 nm using, for example, CVD deposition of $Si_3N_4$. The upper layer 43 is produced with a thickness of 1600 nm, for example, by CVD deposition of $SiO_2$. For structuring the trench mask 4, a lacquer mask (not shown) is applied onto this layer sequence. The trench mask 4 is structured in a $CHF_3/O_2$ dry-etching process using the lacquer mask. The trench mask 4 must be suitable for etching a deep trench.

After the removal of the lacquer mask by lacquer stripping, a trench 5 is etched into the monocrystalline silicon layer 3 using the trench mask 4 (See FIG. 1). For example, the etching occurs anisotropically in a dry-etching process with a $Cl_2/O_2$ chemistry. The etching occurs selectively relative to $SiO_2$. The surface of the insulating layer 2 is, therefore, not attacked by the etching. As soon as the insulating layer 2 has been uncovered, then only the lateral component of the etching process attacks the monocrystalline silicon layer 3. A formation of under-etchings 6 thereby occurs at the boundary surface between the insulating layer 2 and the monocrystalline silicon layer 3. These under-etchings 6 cause the cross-section of the trench 5 to be widened at the surface of the insulating layer 2 (see FIG. 1). The expanse of the under-etchings 6 depends on the extent of the over-etching. The over-etching is usually 10–50%.

Figure 2:
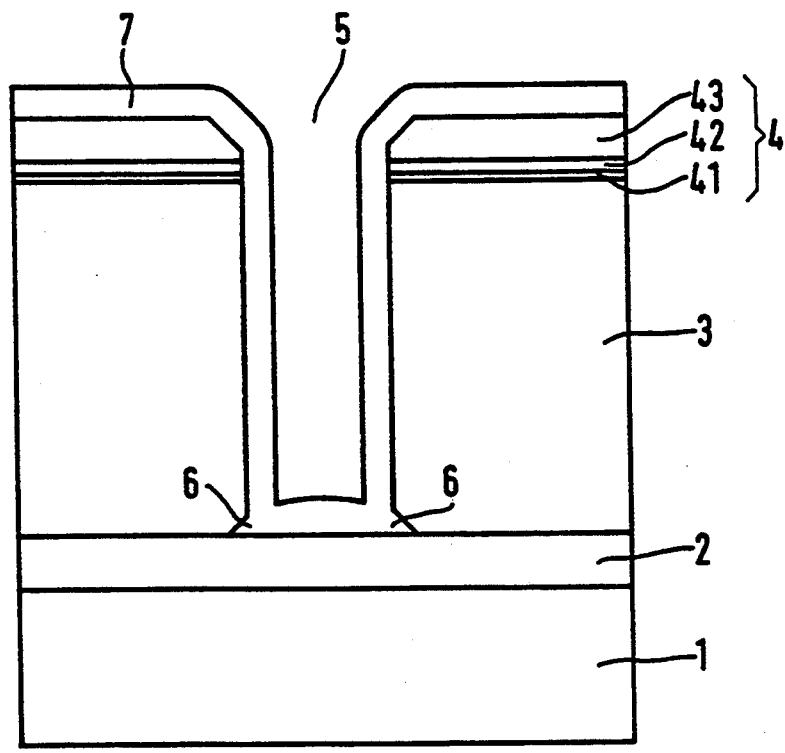
FIG. 2 shows the SOI substrate after deposition of a silicon layer in the present invention.

Subsequently, an amorphous silicon layer 7 having essentially conformal edge coverage is deposited surface-wide. For example, the silicon layer 7 is deposited at 400°–500° C. in a CVD process (See FIG. 2).

The amorphous silicon layer 7 can be deposited undoped or doped depending on the demands of the use made of the insulation trenches. When the amorphous silicon 7 is deposited doped, then it is advantageous to set the doping to at least $10^{20}$ atoms/cm$^3$. $SiO_2$ that arises by thermal oxidation of the surface exhibits intensified flow behavior in this case, analogous to doped glasses such as phosphorous silicate glass or borosilicate glass, but to a less pronounced extent. Mechanical stresses are additionally reduced as a result of this flow behavior.

Figure 3:
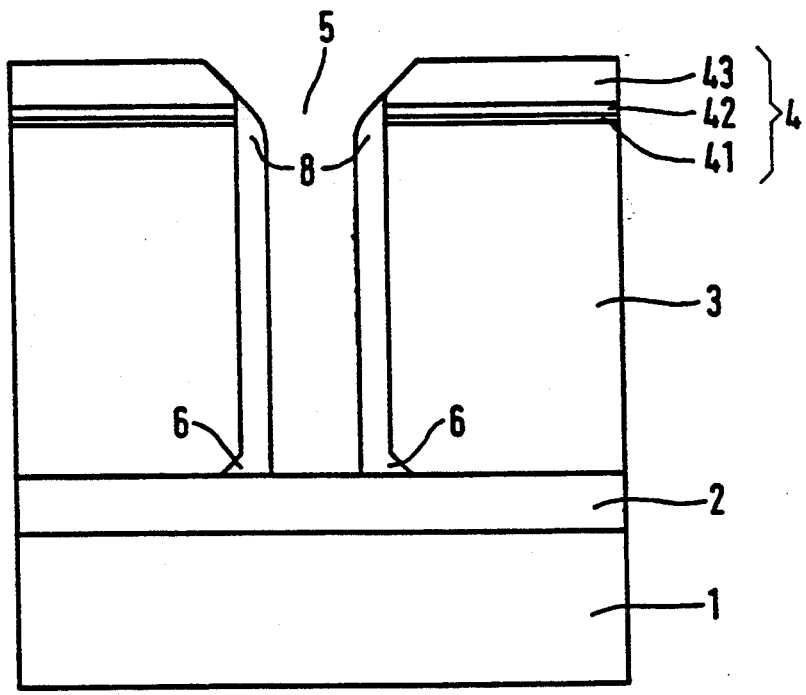
FIG. 3 shows the SOI substrate after spacers have been produced from the silicon layer by anisotropic etching in the present invention.

The layer thickness of the amorphous silicon layer 7 is set depending on the extent of the under-etching 6. For example, it is 500 nm. The amorphous silicon layer 7 is etched in an anisotropic dry-etching process, for example in a HBr/Cl$_2$ plasma, until horizontal surfaces of the trench mask 4 and of the insulating layer 2 have been uncovered (see FIG. 3). Spacers 8 thereby occur at the sidewalls of the trench 5.

The amorphous silicon of the spacer 8 recrystallizes from the boundary surface to the monocrystalline layer 3 in a heating step at, for example, 800° C. The temperature step is implemented until the entire spacer 8 has recrystallized.

Figure 4:
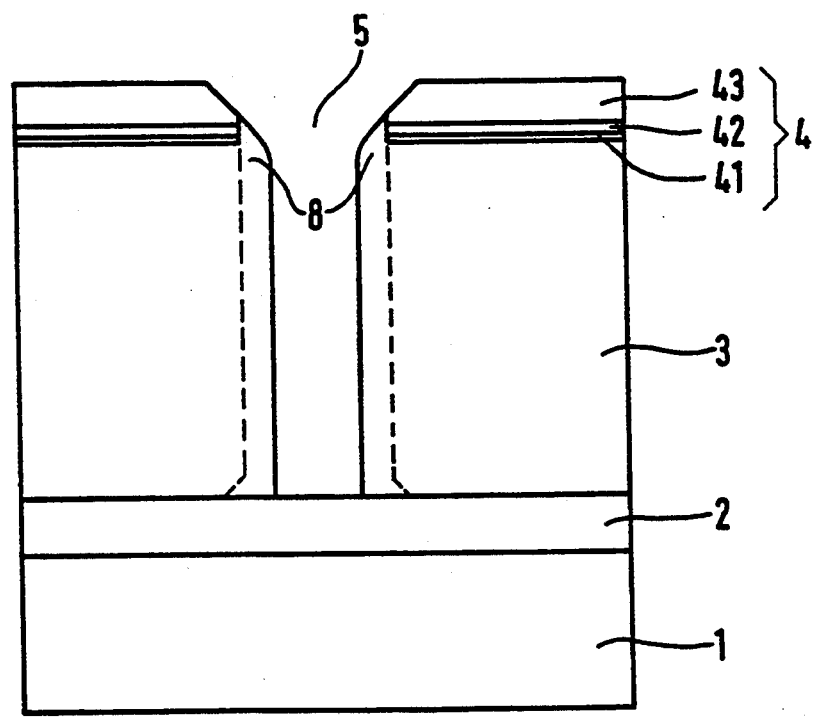
FIG. 4 shows the SOI substrate after recrystallization of the spacers of the present invention.

In FIG. 4, the boundary surface between the monocrystalline layer 3 and the recrystallized spacer 8 is indicated with broken lines. After the recrystallization, the crystal lattice in the spacer 8 complies with the order in the monocrystalline silicon layer 3.

Figure 5:
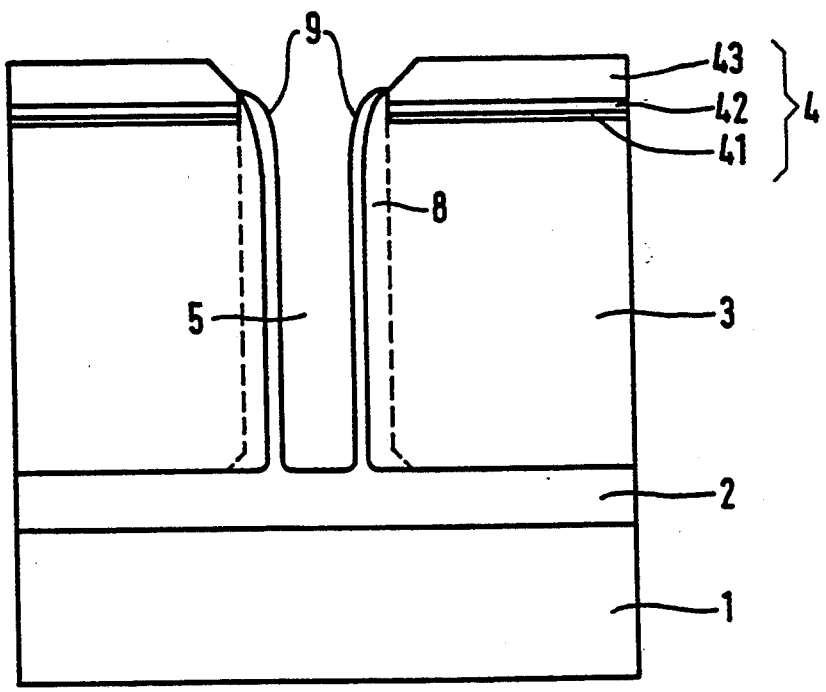
FIG. 5 shows the SOI substrate after partial oxidation of the recrystallized spacers of the present invention.

Subsequently, for example, the spacers are partially oxidized (see FIG. 5). An SiO$_2$ layer 9 thereby occurs at the surface of the spacers 8. For example, the oxidation occurs in a humid atmosphere at 1000°–1200° C. The temperature steps for the recrystallization and for the oxidation can be combined by using a suitable temperature profile. The SiO$_2$ layer 9 has a thickness of approximately 400 nm perpendicularly relative to the surface of the spacers 8. The SiO$_2$ layer 9 exhibits a slight rounding bears virtually no resemblance to a bird's beak at the upper edge of the trench 5 and at the floor of the trench 5. Mechanical stresses in the SiO$_2$ layer 9 occur essentially at the boundary surface to the spacer 8. No defects form in the monocrystalline silicon layer 3 in this case.

For finishing the insulating trench, it lies within the scope of the invention to fill the clearance remaining in the trench 5 (see FIG. 5) by surface-wide deposition of a SiO$_2$ layer with conformal edge coverage. A CVD deposition by using a process gas containing O$_3$ and Si(OC$_2$H$_5$)$_4$, referred to as ozone-TEOS, is suitable for this purpose.

Figure 6:
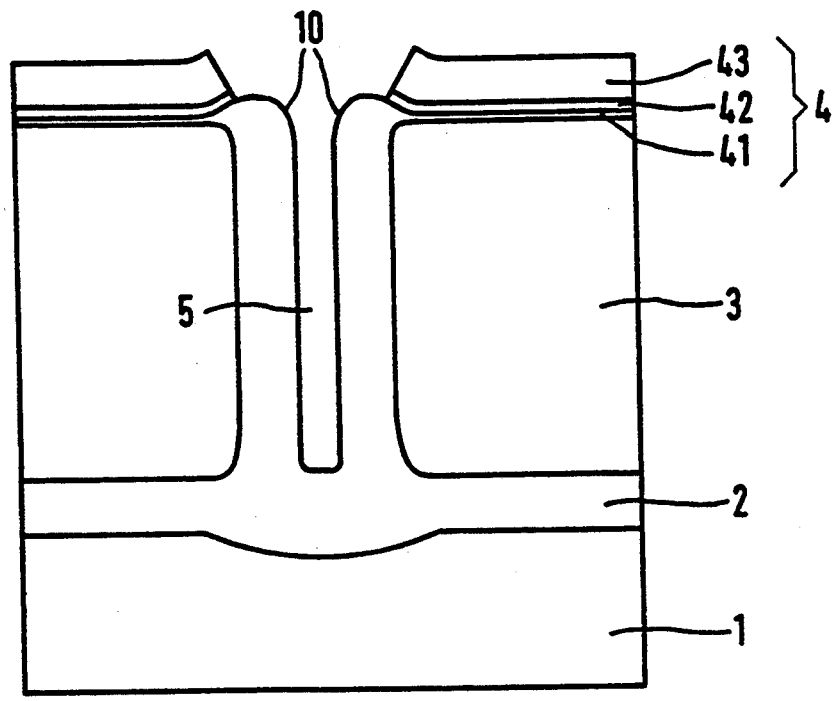
FIG. 6 shows the SOI substrate after complete oxidation of the silicon spacers of the present invention.

In another embodiment of the invention, the spacers 8 are completely oxidized as illustrated in FIG. 4. SiO$_2$ spacers 10 thereby occur (see FIG. 6). For example, the thermal oxidation occurs in a humid atmosphere at 1000°–1200° C. For simplifying the process, the temperature steps for recrystallization and for oxidation can be combined by using an adapted temperature profile. The formation of bird's beak structures at the floor of the trench and at the surface of the trench occurs given the complete oxidation of the spacers 8. The mechanical stresses caused as a result thereof, however, are noticeably less than in a comparable oxidation of an untreated trench. Another related effect is a clearly reduced density of crystal defects in the monocrystalline layer 3.

When doped regions neighboring the trench 5 are to be produced in the monocrystalline layer 3, this can occur by driveout of dopant from the spacer 8 when the spacer is formed of doped silicon. When the dopant concentration in the spacer 8 is at least 10$^{20}$ cm$^{-3}$, then the SiO$_2$ spacer 10 exhibits an improved flow behavior after the complete oxidation, analogous to doped glass such as phosphorous silicate glass or borosilicate glass. Mechanical stresses are thereby additionally reduced. Clearance in the trench 5 remaining between the SiO$_2$ spacers 10 can be subsequently filled with a silicon fill 11 by depositing the amorphous silicon layer and by subsequent etching (see FIG. 7). Subsequently, the surface of the silicon fill 11 is provided with an insulation termination 12 of SiO$_2$ that completely covers the silicon fill 11, being provided therewith, for example, by thermal oxidation in a humid atmosphere at 1000°–1200° C.

Figure 7:
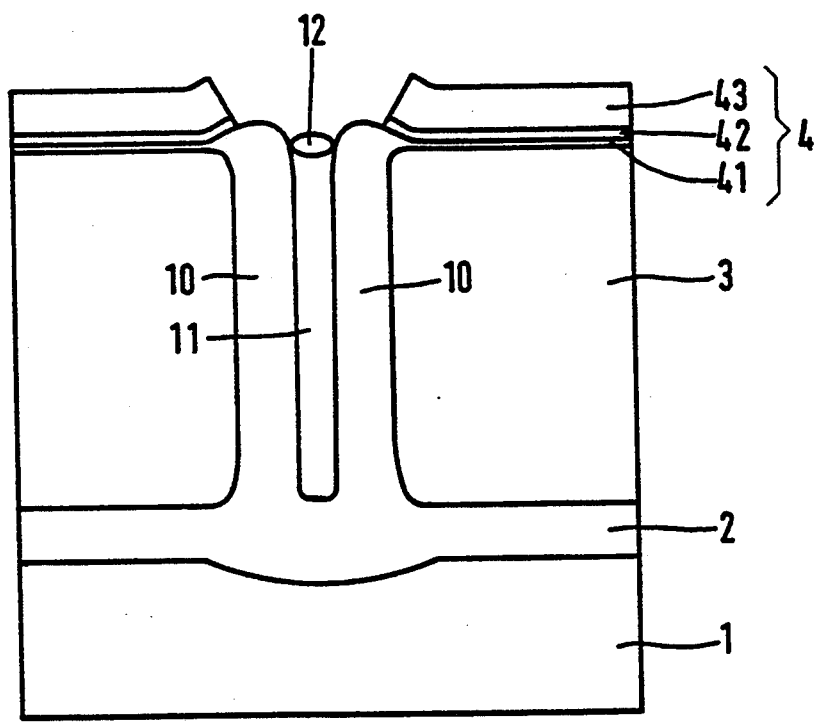
FIG. 7 shows the SOI substrate after filling of clearances remaining in the trench with a silicon fill and after oxidation of the surface of the silicon fill of the present invention.

After finishing the insulation trench as set forth with reference to FIG. 5 or FIG. 7, components are manufactured in the monocrystalline silicon layer 3 within the framework of a planar process. For insulation from one another, these components are arranged in islands of the monocrystalline silicon layer 3 that are each respectively completely surrounded by an insulation trench.

Insulation trenches produced according to the method of the invention are particularly suitable for integration in a 500 volt smart power process.

The method allows highly simplified process management due to the combination of defect reduction with sidewall doping and trench filling. Since only conventional methods of CMOS manufacture are used in the invention, it is compatible with every CMOS method. A variation in the thickness of the deposited silicon layer and a variation of the oxidation time are the only things required for optimizing and matching the method of the invention to different trench geometries.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

I claim:

1. Method for producing an insulation trench in an SOI substrate comprising the steps of:
   providing an SOI substrate having a monocrystalline silicon wafer, an insulating layer of SiO$_2$ arranged thereon and a monocrystalline silicon layer arranged on a surface of said insulating layer;
   etching a trench having sidewalls into said monocrystalline silicon layer, said trench extending onto said insulating layer and having a cross-section at said surface of said insulating layer that is widened by under-etchings of said monocrystalline silicon layer;
   forming a silicon structure to at least cover said sidewalls of said trench and fill said under-etchings;
   recrystallizing said silicon structure by heating said silicon structure;
   at least partially oxidizing said silicon structure; and
   filling said trench with an insulation structure.

2. Method according to claim 1 wherein said step of forming a silicon structure to at least cover said sidewalls of said trench and fill said under-etchings is further defined by forming said silicon structure by surface-wide deposition of an amorphous silicon layer with essentially conformal edge coverage and by a subsequent anisotropic etching to form a spacer.

3. Method according to claim 1 wherein said step of forming a silicon structure to at least cover said sidewalls of said trench and fill said under-etchings is further defined by forming said silicon structure of doped silicon having a dopant concentration of at least 10$^{18}$ atoms/cm$^3$.

4. Method according to claim 1, wherein said steps of recrystallizing and oxidizing said silicon structure are further defined by performing said steps in a single heating step.

5. Method according to claim 1, further comprising the steps of:
   filling a clearance remaining in said trench with a silicon fill for finishing said insulation structure; and
   forming an insulation termination to completely cover said silicon fill by oxidation of the surface of said silicon fill.

6. Method according to claim 1, further comprising the step of:
   filling a clearance remaining in said trench with $SiO_2$ that is conformally deposited in a CVD method for finishing said insulation structure.

7. Method according to claim 6, wherein said step of filling a clearance remaining in said trench is further defined by performing said filling step in a CVD process by using a process gas containing $O_3$ and $Si(OC_2H_5)_4$.

8. Method according to claim 7, wherein said step of etching said trench is further defined by performing said etching step by using a trench mask having a layer sequence comprising a lower layer of $SiO_2$, a middle layer of $Si_3N_4$ and an upper layer of $SiO_2$.

* * * * *